(12) United States Patent
Park et al.

(10) Patent No.: US 6,551,873 B2
(45) Date of Patent: Apr. 22, 2003

(54) METHOD FOR FORMING A TANTALUM OXIDE CAPACITOR

(75) Inventors: Dong-su Park, Kyunggi-do (KR); Hyung Kyun Kim, Kyunggi-do (KR)

(73) Assignee: Hynix Semiconductor Inc, Gyunggi-Do (KR)

( * ) Notice: Subject to any disclaimer, the term of this patent is extended or adjusted under 35 U.S.C. 154(b) by 0 days.

(21) Appl. No.: 10/184,542

(22) Filed: Jun. 28, 2002

(65) Prior Publication Data
US 2003/0001193 A1 Jan. 2, 2003

(30) Foreign Application Priority Data
Jun. 29, 2001 (KR) .................................... 2001-038501

(51) Int. Cl.[7] .......................................... H01L 21/8242
(52) U.S. Cl. ..................... 438/240; 438/253; 438/396; 257/310
(58) Field of Search ........................... 438/3, 240, 253, 438/396; 257/310

(56) References Cited

U.S. PATENT DOCUMENTS

| | | | | |
|---|---|---|---|---|
| 5,274,485 A | * | 12/1993 | Narita et al. | 349/51 |
| 5,985,730 A | * | 11/1999 | Lim | 438/393 |
| 6,203,613 B1 | | 3/2001 | Gates et al. | |
| 6,207,488 B1 | | 3/2001 | Hwang et al. | |
| 6,395,650 B1 | * | 5/2002 | Callegari et al. | 438/785 |
| 6,461,914 B1 | * | 10/2002 | Roberts et al. | 438/253 |
| 2002/0117399 A1 | * | 8/2002 | Chen et al. | 205/125 |
| 2003/0003649 A1 | * | 1/2003 | Park et al. | 359/189 |

* cited by examiner

Primary Examiner—John F. Niebling
Assistant Examiner—Jennifer M. Kennedy
(74) Attorney, Agent, or Firm—Marshall, Gerstein & Borun

(57) ABSTRACT

A method for forming capacitor using a tantalum oxide ($TaO_5$) layer is disclosed. Tantalum oxide is deposited by an atomic layer deposition ALD process so that the step-coverage of the tantalum oxide layer is improved, and accordingly the electrical characteristics of the capacitor are improved.

10 Claims, 2 Drawing Sheets

METHOD FOR FORMING A TANTALUM OXIDE CAPACITOR

BACKGROUND

1. Technical Field

A method for forming a tantalum oxide capacitor is disclosed, and more particularly, a method for forming a tantalum oxide capacitor is disclosed in which tantalum oxide is deposited by an atomic layer deposition (ALD) process so that the step-coverage of the tantalum oxide layer is improved and accordingly the electrical characteristics of the resultant capacitor are improved.

2. Description of the Related Art

In general, a capacitor stores a charge and then supplies the charge required for the operation of a device, such as a semiconductor device. As the integration of the semiconductor devices increases, the size of the cells becomes smaller, and the capacitance required for the operation of the devices increases. The capacitance required in a semiconductor device having a greater integration than 64M DRAM is greater than 30 pF per cell.

Also, as the integration of the semiconductor devices increases, miniaturization of capacitors has been required. However, due to the limitation of the size required in storing a charge to satisfy a required capacitance, difficulties arise in miniaturizing semiconductor capacitors.

The N/O ($SiN_xO_y/SiO_2$) capacitor, which is in current use, cannot be employed with the next generation DRAM which has an integration of greater than 256M. As a result, a tantalum oxide capacitor has been developed. However, as the aspect ratio increases in the tantalum oxide layer according to the miniaturization of the device, the step-coverage characteristic deteriorates. For example, as the design rule is reduced from 0.16 $\mu$m to 0.13 $\mu$m, the step-coverage may be reduced from 96% to 73%.

The reduction of the step-coverage may cause deterioration of the electrical properties of the capacitor, which cause reduction of capacitance of the capacitor. Therefore, a capacitance sufficient to operate the semiconductor cannot be secured. Furthermore, if the lower electrode is made of a metal, the tantalum oxide layer may not be deposited evenly due to the roughness of the surface of the metal, so there is a possibility that the tantalum oxide layer will become too thin in some locations. Such a phenomenon causes a leakage current since the electric field is concentrated when a bias is applied.

Due to such a problem of the conventional art, there is a considerable need for forming the tantalum oxide layer uniformly on the lower electrode, to increase the step coverage and prevent the problem of the tantalum oxide layer becoming too thin as a result of the roughness of the underlying metal electrode.

SUMMARY OF THE DISCLOSURE

Methods for forming a tantalum oxide capacitor are disclosed, in which tantalum oxide is deposited by an atomic layer deposition ALD process so that the tantalum oxide layer is deposited uniformly on a lower electrode, whereby the step-coverage of the tantalum oxide layer is improved and accordingly the electrical characteristics of the capacitor are improved.

One disclosed method for forming a tantalum oxide capacitor comprises: forming a nitride layer by nitriding an upper part of a lower electrode; depositing a tantalum-nitride Ta—N layer on the nitride layer by using an atomic layer deposition ALD method; forming a tantalum oxide layer by oxidizing the tantalum-nitride layer; and forming an upper electrode on the tantalum oxide layer.

As described above, according to one disclosed method for forming a tantalum oxide capacitor, a tantalum-nitride layer is deposited by an atomic layer deposition ALD process and then a tantalum oxide layer is formed by oxidizing the tantalum-nitride layer, and therefore, the step-coverage of the tantalum oxide layer is improved and the electrical characteristics of the capacitor are improved.

BRIEF DESCRIPTION OF THE DRAWINGS

Other objects and aspects of the disclosure will become apparent from the following description of disclosed embodiments with reference to the accompanying drawing wherein:

FIGS. 1 through 5 illustrate a disclosed process for manufacturing a tantalum oxide capacitor according to the disclosure; wherein, FIG. 1 is a sectional view of a lower electrode;

FIG. 2 is a sectional view of a nitride layer formed on the lower electrode of FIG. 1;

FIG. 3 is a sectional view of a tantalum-nitride layer formed on the nitride layer of FIG. 2 by using an atomic layer deposition process;

FIG. 4 is a sectional view of a tantalum oxide layer formed by oxidizing the tantalum-nitride layer of FIG. 3; and FIG. 5 is a sectional view of a tantalum oxide capacitor manufactured by forming an upper electrode on the tantalum oxide layer of FIG. 4.

DETAILED DESCRIPTION OF THE PRESENTLY PREFERRED EMBODIMENTS

Figure 1:
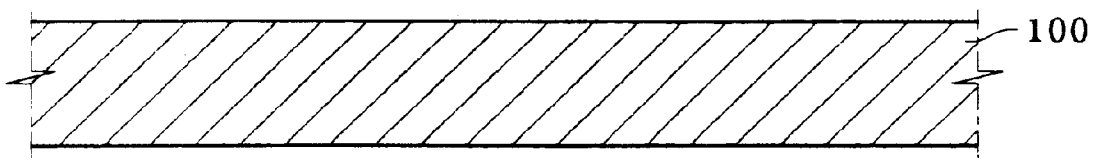
Figure 2:
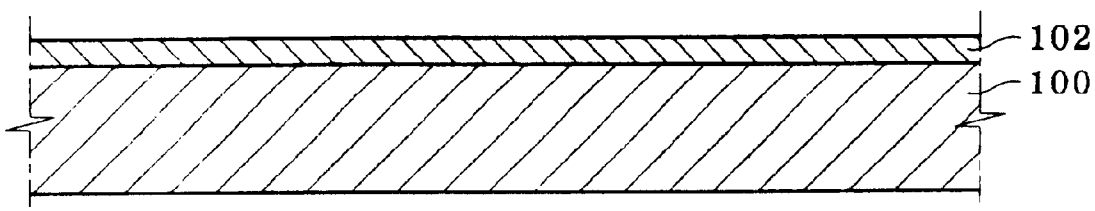

FIGS. 1 through 5 consecutively illustrate a disclosed process for manufacturing a tantalum oxide capacitor. In the drawings, the construction of the lower electrode 100 is shown as a single layer since that is not the main subject of this disclosure. Variations of the lower electrode 100 will be apparent to those skilled in the art.

According to one disclosed process, a nitride layer 102 is first formed on a lower electrode 100 by nitriding the upper part of the lower electrode 100.

More particularly, such a process prevents the forming of an oxide layer (silicon oxide) of low dielectric constant, which may be formed on an interface when a tantalum oxide layer 106 is deposited on the lower electrode 100, wherein the surface of polysilicon is nitrided by using a plasma under a $NH_3$ atmosphere (or $N_2/H_2$, $N_2O$ atmosphere) at a temperature ranging from about 200 to about 600° C., by an In-Situ process in a low pressure chemical vapor deposition chamber. In such a situation, in substitution for using the plasma, a rapid thermal process (RTP) by Ex-Situ or an electrical furnace can be used to nitride in a temperature ranging from about 600 to about 950° C. under an ammonia atmosphere for a time period ranging from about 1 to about 30 minutes.

However, if the lower electrode 100 is made of a metal, the nitriding process becomes different according to the kind of the metal, and in general, the process is performed in a lower temperature than in the case the lower electrode 100 is made of polysilicon. More particularly, the surface of the lower electrode is nitrided using a plasma under $NH_3$ atmosphere (or $N_2/H_2$, $N_2O$, $N_2$, $O_2$, $O_3$ atmosphere) at a temperature ranging from about 200 to about 450° C., by an In-Situ process in a low pressure chemical vapor deposition chamber. Also in such a situation, instead of using plasma, a RTP by Ex-Situ or an electrical furnace can be used to nitride at a temperature ranging from about 400 to about 600° C. under an ammonia atmosphere (or $N_2$, $O_2$, $H_2/O_2$, $N_2/H_2$, $N_2O$ atmosphere), for a time period ranging from about 10 to about 100 seconds and, in case of a RTP and for a time period ranging from about 1 to about 100 minutes in case of the electrical furnace.

Figure 3:
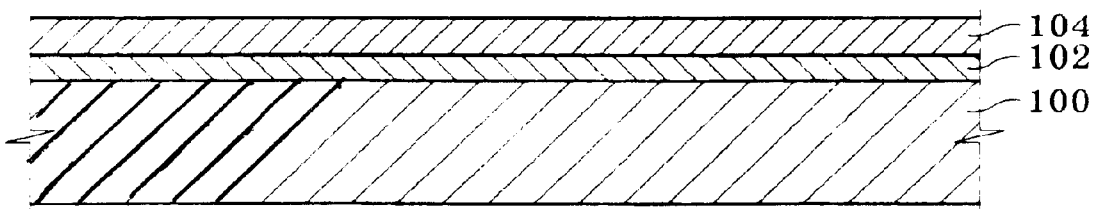

Next, as shown in FIG. 3, a tantalum-nitride layer 104 is deposited on the nitride layer 102 using an atomic layer deposition process.

In performing such a process, a tantalum atomic layer is formed by applying a tantalum hydro fluoride pulse, applying $N_2$ or Ar or another inert gas onto tantalum atomic layer, and a nitride atomic layer is formed by applying an ammonia $NH_3$ pulse. Then, the tantalum atoms and the nitride atoms are combined with each other, to form a tantalum-nitride layer 104. In such a situation, the chemical vapor of a tantalum compound such as the tantalum hydro fluoride can be achieved by supplying a predetermined quantity of the tantalum compound gauged by a quantity controller such as a mass flow controller MFC into an evaporator or an evaporation pipe, and then evaporating the tantalum compound at a temperature ranging from about 150 to about 200° C.

Figure 4:
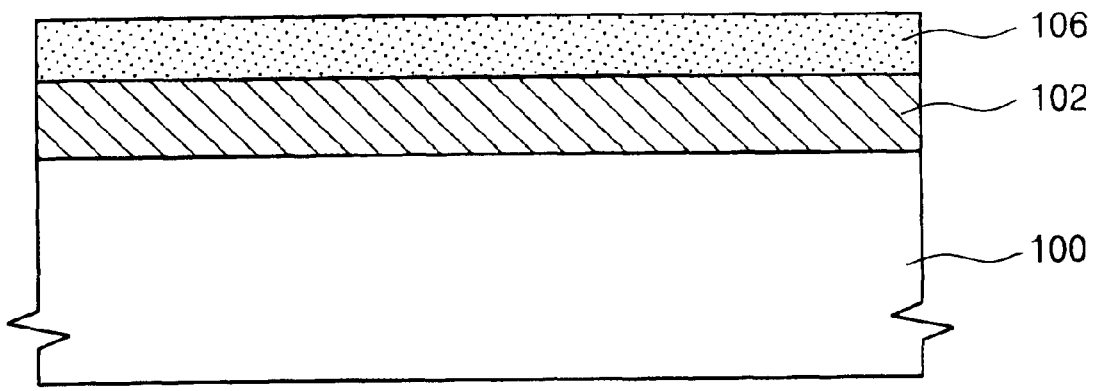

After such a process, as shown in FIG. 4, a tantalum oxide layer 106 is formed by oxidizing the tantalum-nitride layer 104, whereby the nitride in the tantalum-nitride layer 104 is substituted by the oxide to form a stable tantalum oxide layer 106.

More particularly, the tantalum-nitride layer 104 is oxidized by applying oxygen using a plasma at a temperature ranging from about 200 to about 600° C. by an In-Situ process in a low pressure chemical vapor deposition chamber. In such a situation, as a substitute for the plasma, an RTP by Ex-Situ or an electrical furnace can be used to oxidize at a temperature ranging from about 600 to about 950° C. for a time period ranging from about 1 to about 30 minutes under an oxygen atmosphere.

However, in case the lower electrode 100 is made of a metal, the oxidizing process becomes different, and according to the crystalline variation or the proceeding of oxidization, the oxidization process is performed at a lower temperature than in the case the lower electrode 100 is made of polysilicon. More particularly, the tantalum-nitride layer 104 can be oxidized by applying oxygen using a plasma at a temperature ranging from about 200 to about 450° C. by an In-Situ process in a low pressure chemical vapor deposition chamber. Also in such a situation, as a substitute for the plasma, an RTP by Ex-Situ or an electrical furnace can be used to oxidize at a temperature ranging from about 400 to about 600° C. under an oxygen atmosphere, for a time period ranging from about 10 to about 100 seconds in case of the RTP, and for a time period ranging from about 1 to about 100 minutes in case of the electrical furnace.

Figure 5:
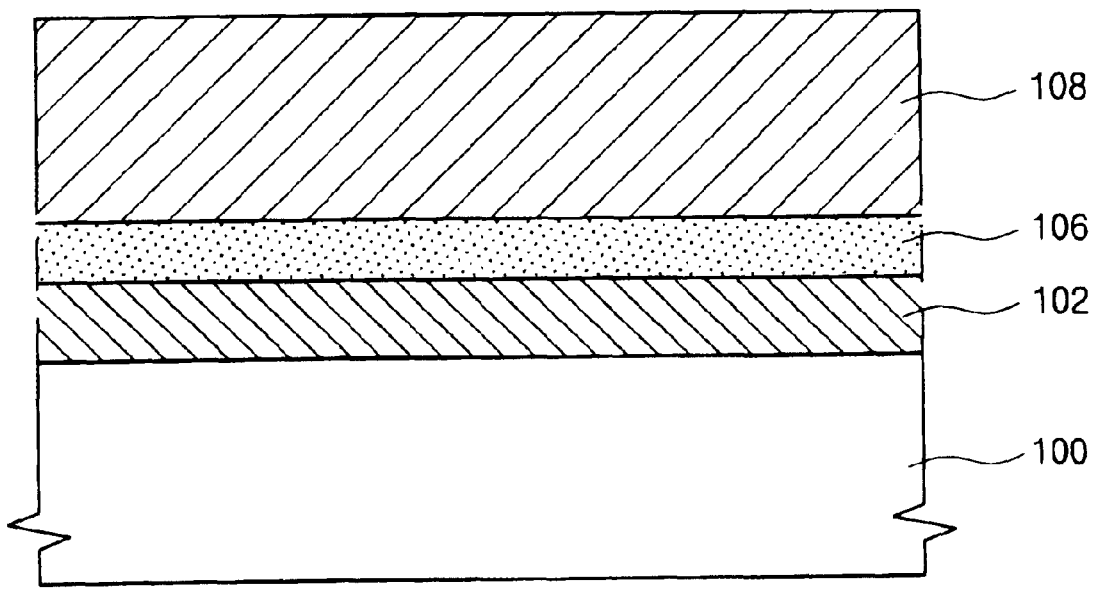

After the oxidizing process, as shown in FIG. 5, the capacitor is manufactured completely by forming the upper electrode 108. The upper electrode 108 can be formed by depositing a single layer or a multiple layer with one or more materials selected from the group consisting of a polysilicon, titanium nitride (TiN), tantalum nitride (TaN), tungsten (W), tungsten nitride (WN), tungsten silicide (WSi), ruthenium (Ru), ruthenium oxide (RuO2), iridium (Ir), iridium oxide (IrO2), and Platinum (Pt).

As described above, according to the disclosed method for forming a tantalum oxide capacitor, tantalum oxide is uniformly deposited by an atomic layer deposition ALD process, and therefore, the step-coverage of the tantalum oxide layer is improved and the electrical characteristics of the capacitor are improved.

Furthermore, in comparison with the conventional atomic layer deposition method, the disclosed method includes fewer process steps, so the time and cost can be reduced and the productivity of the entire manufacturing process can be improved.

Although the preferred embodiment has been described, it will be understood by those skilled in the art that this disclosure should not be limited to the described preferred embodiment, but various changes and modifications can be made within the spirit and the scope of this disclosure. Accordingly, the scope of this disclosure is not limited by the described range but the following claims.

What is claimed is:

1. A method for forming a tantalum oxide capacitor comprising:

forming a nitride layer by nitriding an upper surface of a lower electrode;

depositing a tantalum-nitride layer on the nitride layer by an atomic layer deposition (ALD) method;

forming a tantalum oxide layer by oxidizing the tantalum-nitride layer; and forming an upper electrode on the tantalum oxide layer.

2. The method for forming a tantalum oxide capacitor of claim 1, wherein, in the lower electrode comprises polysilicon, and the forming of the nitride layer is performed by using a plasma under an atmosphere of a gas selected from the group consisting of $NR_3$, $N_2/H_2$, $N_2O$ and mixtures thereof, and at a temperature ranging from about 200 to about 600° C.

3. The method for forming a tantalum oxide capacitor of claim 1, wherein, in the lower electrode comprises a metal, and the forming of the nitride layer is performed by using a plasma under an atmosphere of a gas selected from the group consisting of $NH_3$, $N_2/H_2$, $N_2O$, $O_2$, $H_2O_2$, $N_2$ and mixtures thereof and at a temperature ranging from about 200 to about 450° C.

4. The method for forming a tantalum oxide capacitor of claim 1, wherein the atomic layer deposition method comprises:

forming a tantalum atomic layer by applying a tantalum hydro fluoride ($TaH_2F_7$) pulse;

applying at least one of $N_2$ or an inert gas onto tantalum atomic layer; and forming a nitride atomic layer by applying an ammonia pulse.

5. The method for forming a tantalum oxide capacitor of claim 4, wherein the pulse of tantalum hydro fluoride is applied by supplying a quantity of liquid tantalum hydro fluoride gauged by a quantity controller into an evaporator, and then evaporating the liquid tantalum hydro fluoride at a temperature ranging from about 150 to about 200° C.

6. The method for forming a tantalum oxide capacitor of claim 1, wherein, the lower electrode comprises a polysilicon, and the oxidizing of the tantalum nitride layer is performed by applying oxygen by using a plasma at a temperature ranging from about 200 to about 600° C.

7. The method for forming a tantalum oxide capacitor of claim 6, wherein the oxidizing of the tantalum nitride layer is performed by an In-Situ process in a low pressure chemical vapor deposition chamber.

8. The method for forming a tantalum oxide capacitor of claim 1, wherein, in the lower electrode comprises a metal, and the oxidizing step is performed by applying oxygen by using a plasma at a temperature ranging from about 200 to about 450° C.

9. The method for forming a tantalum oxide capacitor of claim 8, wherein the oxidizing of the tantalum nitride layer is performed by an In-Situ process in a low pressure chemical vapor deposition chamber.

10. The method for forming a tantalum oxide capacitor of claim 1, wherein the upper electrode is formed by depositing a single layer or a multiple layer with one or more materials selected from the group consisting of a polysilicon, titanium nitride, tantalum nitride, tungsten, tungsten nitride, tungsten silicide, ruthenium, ruthenium oxide, iridium, iridium oxide, and Platinum.

* * * * *

UNITED STATES PATENT AND TRADEMARK OFFICE
CERTIFICATE OF CORRECTION

PATENT NO.    : 6,551,873 B2
DATED         : April 22, 2003
INVENTOR(S)   : Park et al.

It is certified that error appears in the above-identified patent and that said Letters Patent is hereby corrected as shown below:

Column 4,
Line 34, after "the group consisting" please delete "of $NR_3$, $N_2/H_2$" and insert -- of $NH_3$, $N_2/H_2$ -- in its place.

Signed and Sealed this

Twenty-fifth Day of November, 2003

JAMES E. ROGAN
*Director of the United States Patent and Trademark Office*